United States Patent
Lee et al.

(10) Patent No.: US 12,282,318 B2
(45) Date of Patent: *Apr. 22, 2025

(54) SEMICONDUCTOR WAFER COOLING

(71) Applicant: Taiwan Semiconductor Manufacturing Company, Ltd., Hsinchu (TW)

(72) Inventors: Yung-Yao Lee, Zhubei (TW); Cheng-Kang Hu, Kaohsiung (TW); Jui-Chun Peng, Hsinchu (TW); Hsu-Shui Liu, Pingjhen (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,037

(22) Filed: Jul. 31, 2023

(65) Prior Publication Data

US 2023/0384776 A1 Nov. 30, 2023

Related U.S. Application Data

(63) Continuation of application No. 17/301,322, filed on Mar. 31, 2021, now Pat. No. 11,768,484.

(51) Int. Cl.
*G05B 19/418* (2006.01)
*G06T 7/13* (2017.01)
*G06T 7/62* (2017.01)

(52) U.S. Cl.
CPC ......... *G05B 19/41875* (2013.01); *G06T 7/13* (2017.01); *G06T 7/62* (2017.01); *G05B 2219/45027* (2013.01); *G05B 2219/45028* (2013.01); *G05B 2219/45031* (2013.01); *G05B 2219/45183* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 6,266,125 B1 * | 7/2001 | Fukuda | G03F 7/26 118/712 |
| 8,376,637 B2 * | 2/2013 | Yamada | H01L 21/67196 396/611 |
| 10,712,672 B2 * | 7/2020 | Jochemsen | G03F 7/70633 |

(Continued)

FOREIGN PATENT DOCUMENTS

| | | |
|---|---|---|
| JP | 2006080410 A | 3/2006 |
| JP | 2015102389 A | 6/2015 |
| KR | 101647688 B1 | 8/2016 |

*Primary Examiner* — Jason Lin
(74) *Attorney, Agent, or Firm* — Harrity & Harrity, LLP

(57) ABSTRACT

A cooling controller receives, from one or more sensors, wafer information associated with a wafer. The cooling controller determines a pattern mask area for the wafer based on the wafer information. The cooling controller determines a cooling time for the wafer based on the pattern mask area. The cooling controller causes a cooling plate to cool the wafer for a time duration equal to the cooling time. Determining the cooling time for a wafer based on a pattern mask area provides stable and consistent wafer temperatures for wafers having different mask and layout properties, which reduces mask overlay variation and increases wafer yield.

20 Claims, 13 Drawing Sheets

(56) References Cited

U.S. PATENT DOCUMENTS

| | | | | |
|---|---|---|---|---|
| 11,195,744 B2* | 12/2021 | Fujii | ............... | H01L 21/68764 |
| 2005/0177811 A1* | 8/2005 | Kotani | ............... | H01L 22/20 |
| | | | | 430/30 |
| 2005/0273754 A1* | 12/2005 | Nojima | ............... | G03F 1/36 |
| | | | | 716/52 |
| 2008/0215276 A1* | 9/2008 | Fang | ............... | G03F 1/00 |
| | | | | 250/311 |
| 2009/0250826 A1* | 10/2009 | Inomata | ............... | H01L 23/145 |
| | | | | 257/789 |
| 2010/0036514 A1* | 2/2010 | Funk | ............... | G05B 17/02 |
| | | | | 700/103 |
| 2015/0316861 A1* | 11/2015 | Cheng | ............... | G03F 1/70 |
| | | | | 355/30 |
| 2016/0376697 A1* | 12/2016 | Fujinaga | ............... | H01J 37/3464 |
| | | | | 204/298.09 |
| 2017/0028560 A1* | 2/2017 | Senn | ............... | H01L 21/682 |
| 2018/0218925 A1* | 8/2018 | Shigetomi | ............... | H01L 21/67103 |
| 2019/0198299 A1* | 6/2019 | Watanabe | ............... | H01L 21/67115 |
| 2022/0034708 A1* | 2/2022 | Elliott | ............... | G01J 5/0007 |
| 2022/0317668 A1 | 10/2022 | Lee et al. | | |

* cited by examiner

SEMICONDUCTOR WAFER COOLING

RELATED APPLICATION

This application is a continuation of U.S. patent application Ser. No. 17/301,322, filed Mar. 31, 2021, which is incorporated herein by reference in its entirety.

BACKGROUND

A semiconductor device may be developed on a wafer through the use of various processing techniques. One technique includes photolithography, where a photoresist is applied to a wafer and exposed to a radiation source to transfer a device pattern from a photomask to the photoresist. The wafer may be patterned through a plurality of exposure stages to build up the layers of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
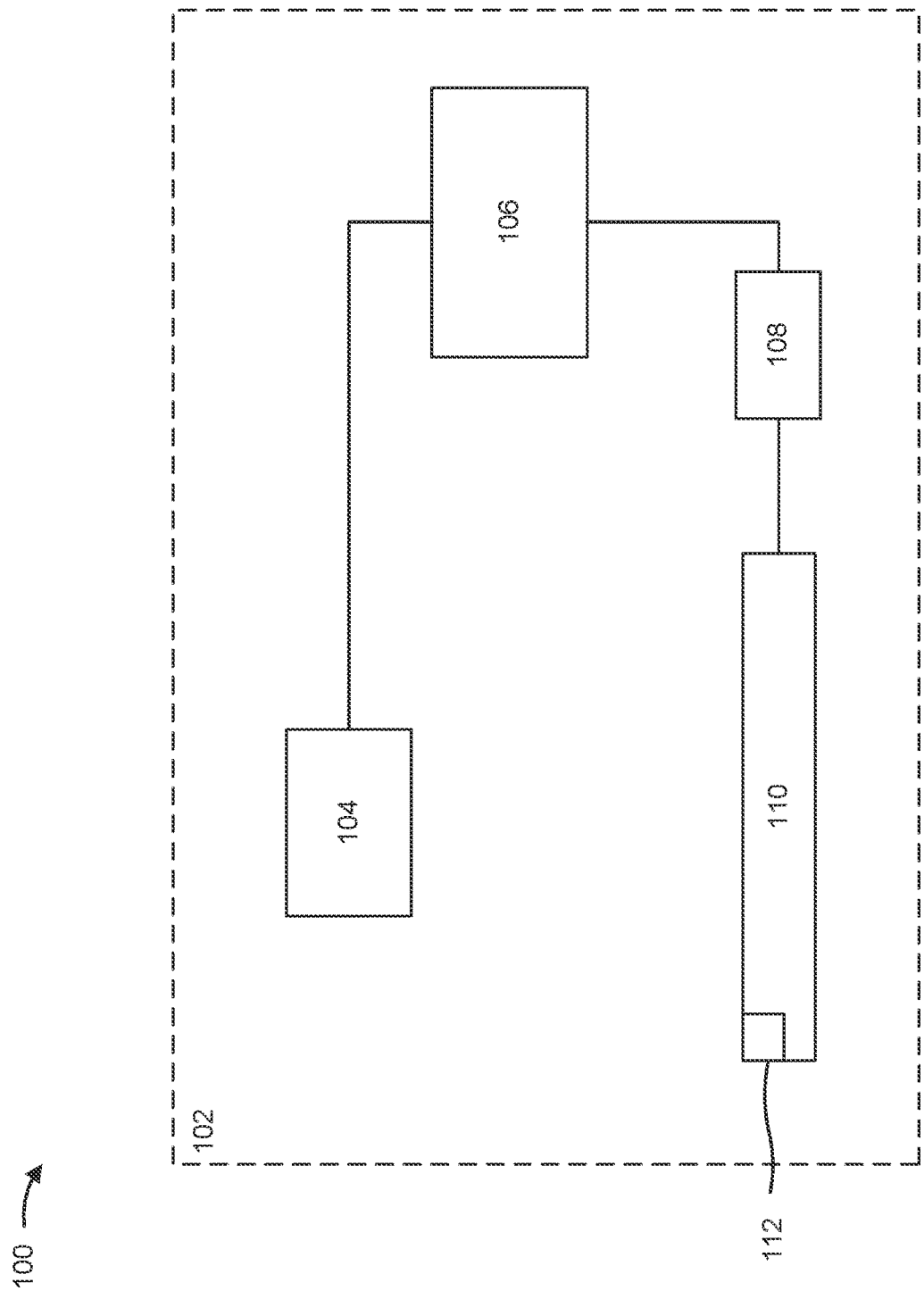
FIGS. 1A-1F are diagrams of one or more example implementations described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A wafer may be cooled prior to exposing a photoresist on the wafer to a radiation source for patterning. Cooling the wafer (e.g., to room temperature) may reduce processing defects by reducing thermal expansion of the wafer and/or photoresist. Reducing thermal expansion reduces overlay issues such as photomask misalignment between different exposure stages for a wafer and photomask alignment variation between different wafers.

A wafer may be cooled by placing the wafer on a cooling plate and causing the cooling plate to cool the wafer for a particular amount of time. In some cases, wafers are cooled for the same fixed amount of time (e.g., 20 seconds, 30 seconds, or another fixed amount of time). While this provides some thermal expansion reduction, different exposure stages may expose a wafer to a radiation source for different amounts of time, which may result in inconsistent wafer heating and thus different temperatures across exposure stages of the wafer. Different wafer temperatures across the exposure stages may cause degraded overlay performance as a result of photomask misalignment due to thermal expansion or contraction of the wafer.

Some implementations described herein provide techniques and apparatuses for semiconductor wafer cooling. In some implementations, a cooling device is provided. The cooling device may be a learning cooling device in that the cooling device is capable of determining a cooling time for a wafer as opposed to using a default or fixed cooling time for cooling the wafer. The cooling device may determine the cooling time for the wafer based on a pattern mask area for the wafer (which may also be referred to as an exposure field area or another term that specifies the area of the wafer that is to be exposed during each step of a photomask within an exposure stage). The larger the pattern mask area, fewer steps of the photomask used to pattern the wafer during an exposure stage. Conversely, the smaller the pattern mask area, more steps of the photomask used to pattern the wafer during an exposure stage.

Accordingly, the cooling device may use the pattern mask area as an indicator of exposure time for the wafer to determine an appropriate cooling time for the wafer. For example, the cooling device may determine a longer cooling time for a wafer that is to be exposed using a smaller pattern mask area (and thus, a longer exposure time) than a cooling time for a wafer that is to be exposed using a larger mask area (and thus, a shorter exposure time). In this way, the cooling device may cause a cooling plate to cool a wafer for an amount of time equal to a cooling time determined for a wafer based on the wafer's pattern mask area. This ensures that the wafer exposure time and cooling time are synchronized, which reduces photomask misalignment between different exposure stages for a wafer and increases photomask overlay performance.

FIGS. 1A-1F are diagrams of one or more example implementations 100 described herein. As shown in FIGS. 1A-1F, example implementation(s) 100 may include a cooling device 102. Cooling device 102 may cool a wafer after the wafer is coated with a photoresist and prior to exposure to a radiation source by an exposure device (e.g., a stepper or scanner). In some implementations, the exposure device and cooling device 102 are combined as part of the same device. In some implementations, cooling device 102 is included in the exposure device. In some implementations, cooling device 102 is a standalone device separate from the exposure device.

As shown in FIG. 1A, the cooling device 102 may include one or more sensors 104, a cooling controller 106, a signal converter 108, a cooling plate 110, and a cooling plate sensor 112. Sensor(s) 104 include one or more sensor devices capable of generating wafer information associated with a wafer. For example, sensor(s) 104 may include a camera, a laser, a photosensor, and/or a similar type of device. Cooling controller 106 includes a device capable of determining a pattern mask area for a wafer, capable of determining a cooling time for a wafer, capable of performing other actions associated with cooling device 102, or a combination thereof. Signal converter 108 includes a device capable of converting an analog signal to a digital signal, and vice versa. Cooling plate 110 includes a fixture capable of supporting and cooling a wafer. Cooling plate sensor 112 includes a sensor device capable of detecting the presence of a wafer and/or a temperature of the cooling plate.

Sensor(s) 104 may be positioned to capture an image scan of the entire wafer or a portion thereof. For example, sensor(s) 104 may be positioned within a range of about 100 millimeters (mm) to about 1000 mm from the wafer (e.g., from the top surface of the photoresist on the wafer) and aligned near the center of the wafer. Cooling plate sensor 112 may be positioned at a particular distance from the center of the wafer, such as within a range of about 10 mm to about 300 mm. Moreover, cooling plate 110 may be positioned such that cooling plate sensor 112 is capable of detecting the presence of the wafer on cooling plate 110 within a sensing range (e.g., 1 mm to 50 mm from the top surface of the cooling plate). The above described ranges are examples only, and other ranges and/or distances may be used.

Figure 1B:
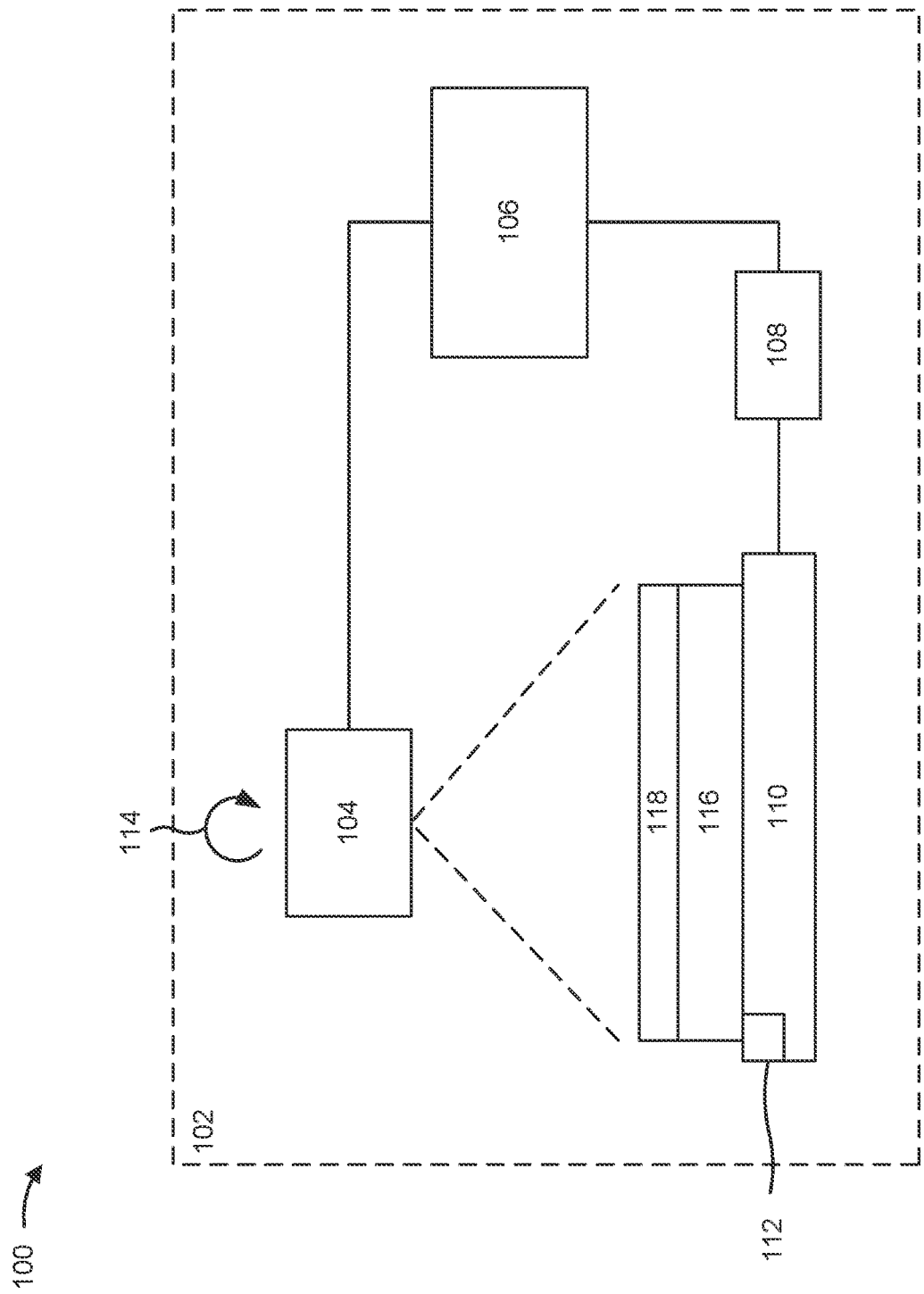

As shown in FIG. 1B, and by reference number 114, sensor(s) 104 may generate wafer information associated with a wafer 116. Wafer 116 may be positioned on cooling plate 110 in preparation for cooling after a photoresist 118 is applied to wafer 116. The wafer information may include an image scan of wafer 116 (e.g., an image captured by a camera or photosensor), may include an indication of a time and a date that the image scan was generated, may include an indication of an exposure stage for wafer 116, and/or one or more other types of information.

In some implementations, sensor(s) 104 generate the wafer information based on an indication (e.g., an instruction or a request) from cooling controller 106. For example, cooling controller 106 may receive information from cooling plate sensor 112 indicating the presence of wafer 116 (e.g., indicating that wafer 116 has been placed on cooling plate 110). Cooling plate sensor 112 may provide the information (e.g., which may include an analog signal such as a proximity sensor signal) to signal converter 108. Signal converter 108 may convert the analog signal to a digital output, and may provide the digital output to indicate the presence of wafer 116 to cooling controller 106. Cooling controller 106 may receive the indication of the presence of wafer 116 and may provide a signal (e.g., the indication or a signal generated based on the indication) to sensor(s) 104 to generate the wafer information.

Figure 1C:
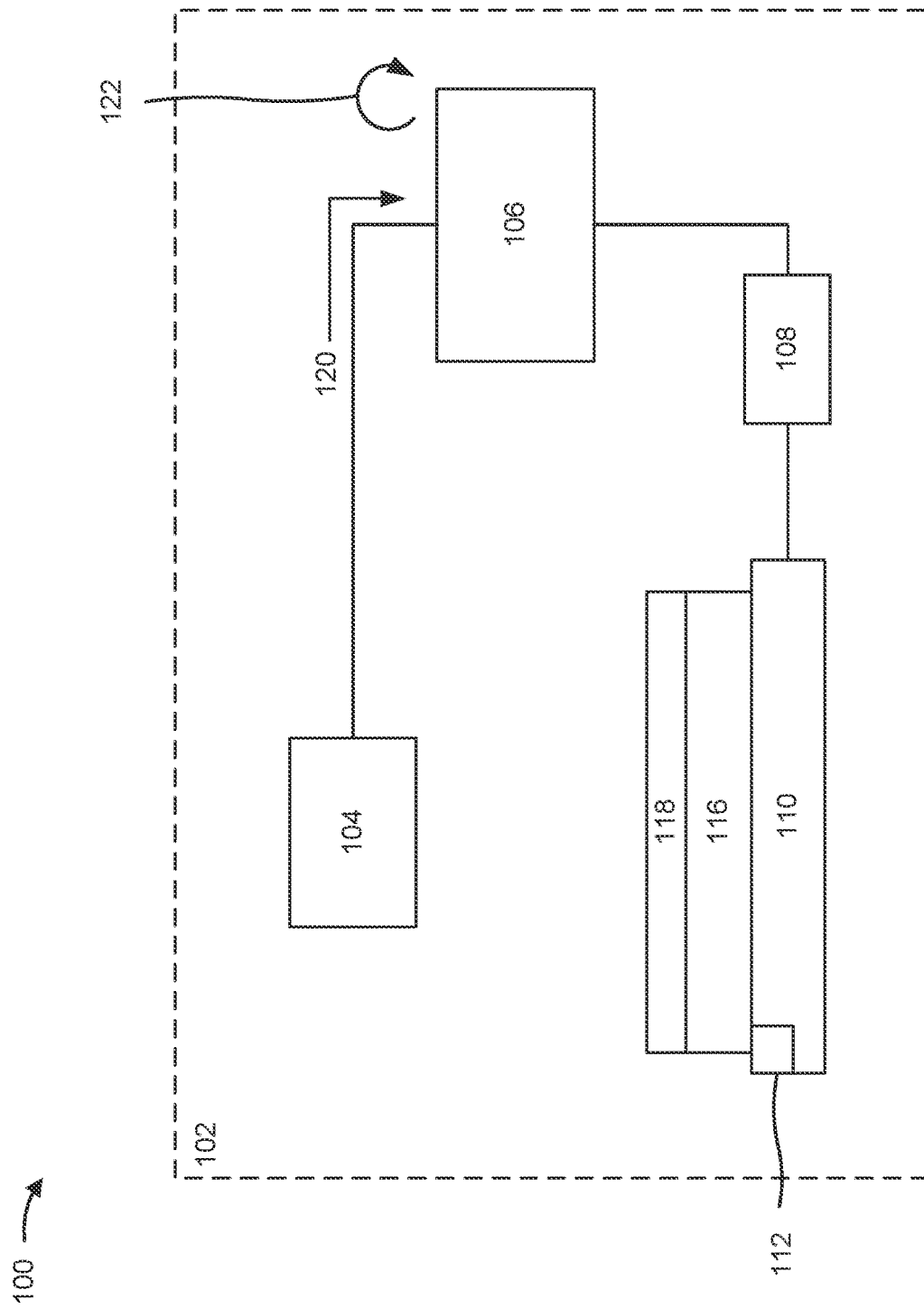

As shown in FIG. 1C, and by reference number 120, sensor(s) 104 may provide the wafer information to the cooling controller 106. Cooling controller 106 may receive the wafer information via a wired and/or a wireless network, via a wired communication link, such as an Ethernet link or an optical fiber, and/or through another communication medium. In some implementations, sensor(s) 104 automatically provide the wafer information to cooling controller 106 in response to or as a result of generating the wafer information. In some implementations, sensor(s) 104 provide the wafer information to cooling controller 106 based on receiving, from cooling controller 106, a signal or an instruction to provide the wafer information.

As further shown in FIG. 1C, and by reference number 122, cooling controller 106 may determine a pattern mask area for wafer 116 based on the wafer information. In some implementations, cooling controller 106 determines the pattern mask area based on receiving the wafer information from the sensor(s) 104.

Figure 1D:
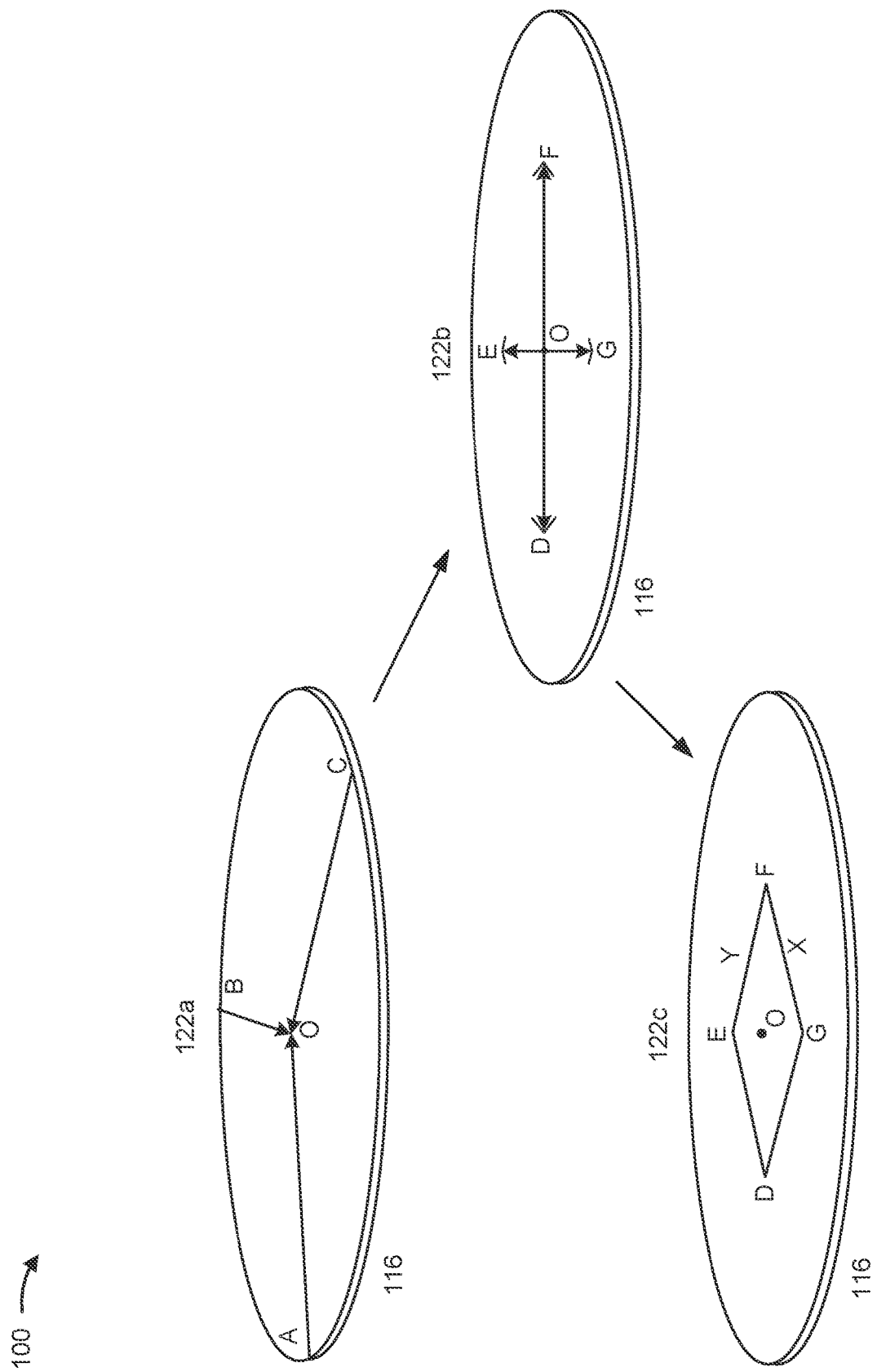

As shown in FIG. 1D, and by reference number 112a, determining the pattern mask area for wafer 116 may include determining a center point (O) of wafer 116. For example, cooling controller 106 may determine the center point (O) of wafer 116 based on a plurality of edge points of wafer 116 (e.g., edge points A, B, and C). In some implementations, cooling controller 106 determines the edge points based on an image scan of wafer 116 provided in the wafer information from sensor(s) 104. For example, cooling controller 106 may analyze and/or process the image scan based on contrast in the image scan (e.g., contrast between light and dark areas in the image scan) to identify the perimeter or circumference of wafer 116. Cooling controller 106 may identify or select three (or a different quantity of) edge points that are equidistant or equally spaced apart along the perimeter or circumference of wafer 116. Cooling controller 106 may determine respective vectors from each edge point (e.g., vector AO, vector BO, and vector CO) such that the vectors all intersect or meet at a single point on wafer 116. Cooling controller 106 may determine or identify the point of intersection (or the meeting point) of the vectors as the center point (O) of wafer 116.

As further shown in FIG. 1D, and by reference number 122b, determining the pattern area mask for wafer 116 may include determining a plurality of field edge points for wafer 116 (e.g., field edge points D, E, F, and G). Cooling controller 106 may determine the plurality of edge points by determining or identifying a length for respective vectors from the center point (O) of wafer 116 to be used to determine each edge point (e.g., vector OD, vector OE, vector OF, and vector OG). Cooling controller 106 may determine the direction of each vector such that adjacent vectors are orthogonal and the plurality of edge points form 900 or right angles.

In some implementations, cooling controller 106 may determine the length of each vector (and thus, the location of each field edge point) based on various parameters and/or factors. For example, cooling controller 106 may determine the length of each vector (and thus, the location of each field edge point) based on parameters of a photomask that is to be used to pattern photoresist 118 on wafer 116, such as a die size, a field size, a transmission rate, and/or the like. As another example, cooling controller 106 may determine the length of each vector (and thus, the location of each field edge point) based on parameters of wafer 116 (e.g., as determined from the wafer information), such as a line pitch or line spacing, a semiconductor device or die spacing, and/or the like. Cooling controller 106 may determine the parameters of wafer 116, for example, based on contrast in the image scan of wafer 116 (e.g., by identifying the line pitch or line spacing, the semiconductor device or die spacing, and/or the like based on contrast between features or components captured in the image scan).

As further shown in FIG. 1D, and by reference number 122c, determining the pattern mask area for wafer 116 may include determining the pattern mask area based on the plurality of field edge points (D, E, F, G) determined by cooling controller 106. For example, cooling controller 106 may determine connecting lines between adjacent field edge points to form an enclosed area around the center point (O) of wafer 116. Cooling controller 106 may determine the pattern mask area based on a length (X) and a width (Y) of the enclosed area (e.g., X*Y).

Figure 1E:
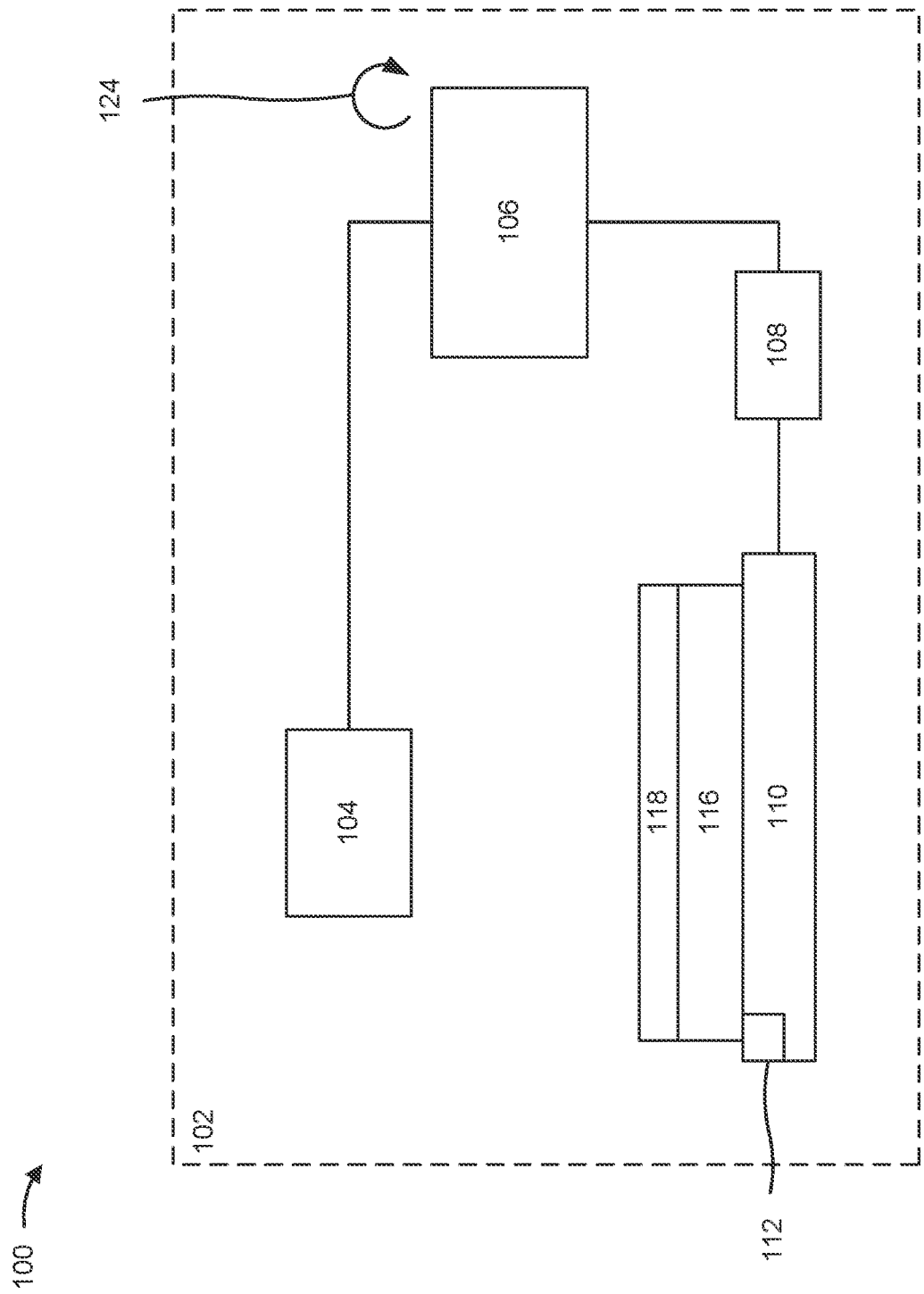

As shown in FIG. 1E, and by reference number 124, cooling controller 106 may include one or more devices capable of determining a cooling time ($T_F$) for wafer 116 based on the pattern mask area. Additionally and/or alternatively, cooling controller 106 may determine the cooling time based on other information, such as a mask field utilization for wafer 116 (e.g., a factor, a ratio, or a percentage of the pattern mask area or exposure field that is utilized to transfer a pattern from a photomask to photoresist 118 on wafer 116).

To determine the cooling time ($T_F$) for wafer 116, cooling controller 106 may determine a time adjustment ($\Delta T$), which may include an amount of time for adjusting a default cooling time ($T_I$). The default cooling time may be a standard or fixed cooling time that is typically used to cool wafers (e.g., without the use of a learning cooling device as described herein). In these cases, the time adjustment ($\Delta T$) may be used to increase or decrease the cooling time ($T_F$) based on the pattern mask area for wafer 116.

In some implementations, the cooling controller determines the time adjustment ($\Delta T$) based on Equation 1:

$$\Delta T = \alpha * PMA \qquad \text{Equation 1}$$

where PMA is the pattern mask area for wafer 116 and $\alpha$ is a scaling factor applied to the pattern mask area. Example scaling factors include 0.5, 1, or 2, among other examples. In some implementations, cooling controller 106 may determine the scaling factor $\alpha$ based on the pattern mask area. For example, cooling controller 106 may determine the scaling factor $\alpha$ such that a relatively large pattern mask area results in a negative time adjustment ($\Delta T$) (and thus, a decreased cooling time ($T_F$)) or such that a relatively small pattern mask area results in a positive time adjustment ($\Delta T$) (and thus, an increased cooling time ($T_F$)). In some implementations, the scaling factor $\alpha$ is a negative value if the pattern mask area satisfies a threshold area, and is a positive value if the pattern mask area does not satisfy the threshold area. In some implementations, the scaling factor $\alpha$ decreases as the pattern mask area increases and increases as the pattern mask area decreases.

In some implementations, cooling controller 106 determines the cooling time ($T_F$) based on Equation 2:

$$T_F = T_I + \Delta T \qquad \text{Equation 2}$$

where $T_I$ is the default cooling time and $\Delta T$ is the time adjustment (e.g., as determined based on Equation 1 above). In some implementations, cooling controller 106 stores (e.g., in a storage device or memory device) information identifying the default cooling time ($T_I$). In some implementations, cooling plate sensor 112 provides an indication of the default cooling time ($T_I$) to cooling controller 106 (e.g., via the signal converter). In some implementations, the default cooling time ($T_I$) may be indicated in exposure process information, which may be based on the exposure device that is to be used for wafer 116, may be based on the type of exposure that is to be used for wafer 116, may be based on other parameters or a combination thereof.

As indicated above, the time adjustment ($\Delta T$) may be a negative value or a positive value. If the time adjustment ($\Delta T$) is a negative value, cooling controller 106 decreases the default cooling time ($T_I$) by the time adjustment ($\Delta T$), which results in a cooling time ($T_F$) having a shorter time duration relative to the time duration of the default cooling time ($T_1$). If the time adjustment ($\Delta T$) is a positive value, cooling controller 106 increases the default cooling time ($T_1$) by the time adjustment ($\Delta T$), which results in a cooling time ($T_F$) having a longer time duration relative to the time duration of the default cooling time ($T_1$).

Figure 1F:
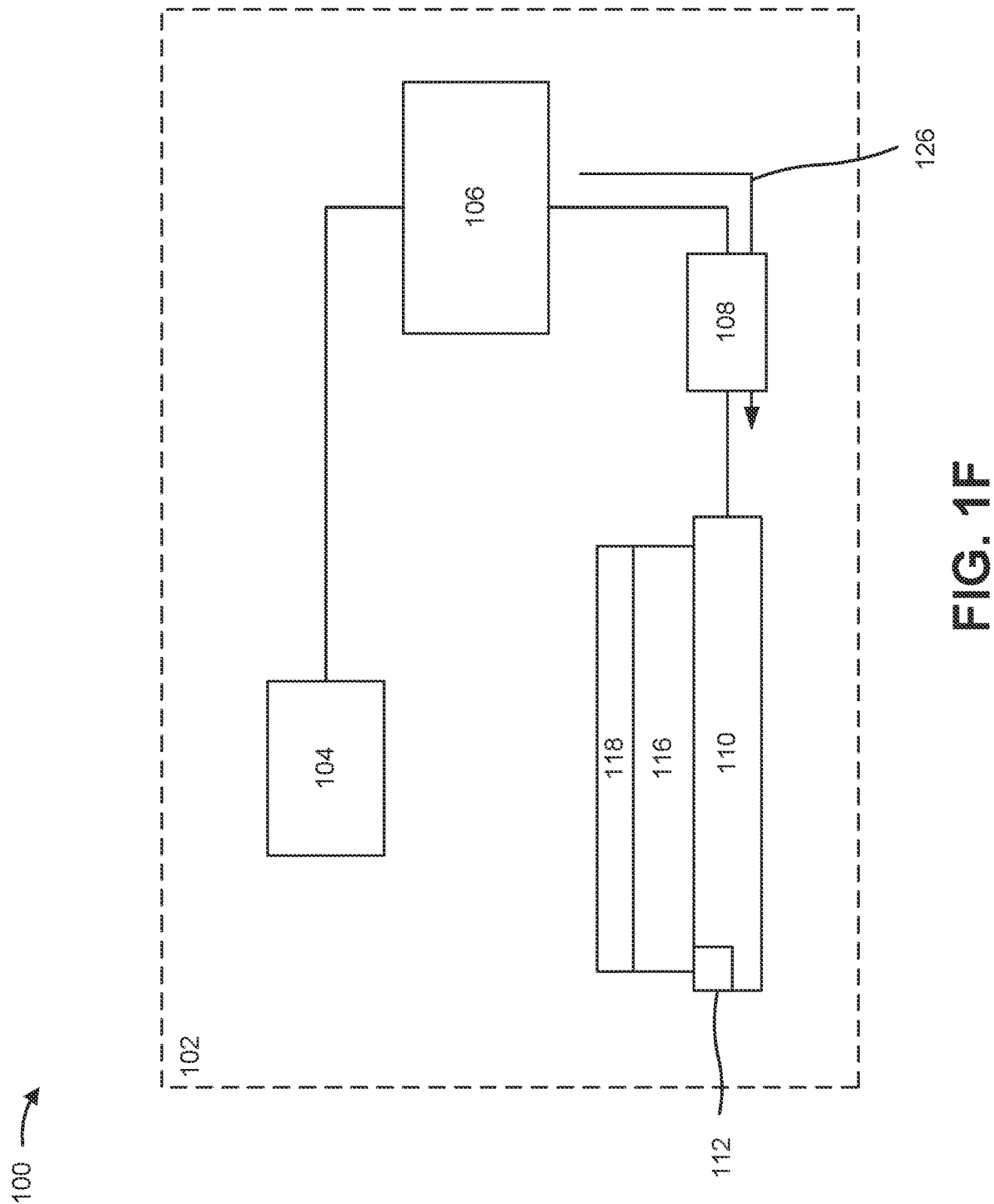

As shown in FIG. 1F, and by reference number 126, cooling controller 106 may cause cooling device 102 to cool wafer 116 for the cooling time ($T_F$) using cooling plate 110. In particular, cooling controller 106 may cause cooling plate 110 to cool wafer 116 for a time duration that is equal to the cooling time ($T_F$). In other words, the time duration between the time at which cooling plate 110 starts to cool wafer 116 and the time at which cooling plate 110 stops cooling wafer 116 is the time duration of the cooling time ($T_F$) determined by cooling controller 106.

In some implementations, cooling controller 106 causes cooling plate 110 to cool wafer 116 for the cooling time ($T_F$) by providing a signal to cooling plate 110 via signal converter 108. Signal converter 108, cooling plate 110, and cooling controller 106 may be communicatively connected via one or more communication links, via one or more electrical cables, and/or via other communication mediums. Cooling controller 106 may provide the signal to signal converter 108 as a digital signal. Signal converter 108 may receive the digital signal and convert the digital signal to an analog signal (e.g., a voltage, a current, and/or the like). Signal converter 108 may provide the analog signal to cooling plate 110, which may cause cooling plate 110 to initiate the time duration for cooling wafer 116. In some implementations, the cooling time ($T_F$) commences once the signal is provided to cooling plate 110. In some implementations, the cooling time ($T_F$) commences once cooling plate 110 reaches a particular temperature (e.g., as indicated by cooling plate sensor 112). In these cases, cooling plate sensor 112 may provide an indication of the temperature of cooling plate 110 to cooling controller 106, and cooling controller 106 may initiate the cooling time ($T_F$) based on determining that the temperature indication from cooling plate sensor 112 has reached a particular temperature. In some implementations, the cooling time ($T_F$) commences when cooling plate 110 or cooling plate sensor 112 senses presence of wafer 116.

Cooling plate 110 may cool wafer 116 for the duration of the cooling time ($T_F$) by extracting, removing, or otherwise exchanging heat from wafer 116 with cooling from cooling plate 110. For example, cooling plate 110 may be cooled or chilled to a particular temperature below the temperature of wafer 116 such that the difference in temperatures causes a heat exchanging effect between wafer 116 and cooling plate 110.

Cooling controller 106 may cause cooling plate 110 to stop cooling wafer 116 at the end of the cooling time ($T_F$). In some implementations, cooling controller 106 may cause cooling plate 110 to stop cooling wafer 116 by stopping or removing the signal provided to cooling plate 110 via signal converter 108, by providing a signal to cause cooling plate 110 to stop cooling, or by other techniques. In some implementations, cooling controller 106 may cause cooling plate 110 to stop cooling wafer 116 by causing wafer 116 to be removed from cooling plate 110.

Once the cooling time ($T_F$) is complete, cooling device 102 may provide wafer 116, or may cause wafer 116 to be provided, to an exposure device for exposure to a radiation source so that a pattern may be transferred to photoresist 118 on wafer 116. In some implementations, cooling device 102 may continue to process wafers or wafer lots (e.g., groups of wafers that are to be subjected to the same or similar processing steps and/or parameters) in a manner as described in connection with reference numbers 114, 122, 124, and 126.

In this way, cooling device 102 may be a learning cooling device in that cooling device 102 is capable of determining a cooling time for wafer 116 as opposed to using a default or fixed cooling time for cooling wafer 116. Cooling device 102 may determine the cooling time for wafer 116 based on a pattern mask area for wafer 116, which may be an indicator of the exposure time for an exposure stage for wafer 116. Cooling device 102 may cause cooling plate 110 to cool wafer 116 for an amount of time equal to the cooling time. This ensures that the wafer exposure time and cooling time are synchronized, which reduces photomask misalignment between different exposure stages for a wafer and increases photomask overlay performance.

As indicated above, FIGS. 1A-1F are provided merely as one or more examples. Other examples may differ from what is described with regard to FIGS. 1A-1F. In some implementations, cooling device 102 of FIGS. 1A-1F includes a greater quantity of devices and/or components, a smaller quantity of devices and/or components, and/or a different combination of devices and/or components.

Figure 2:
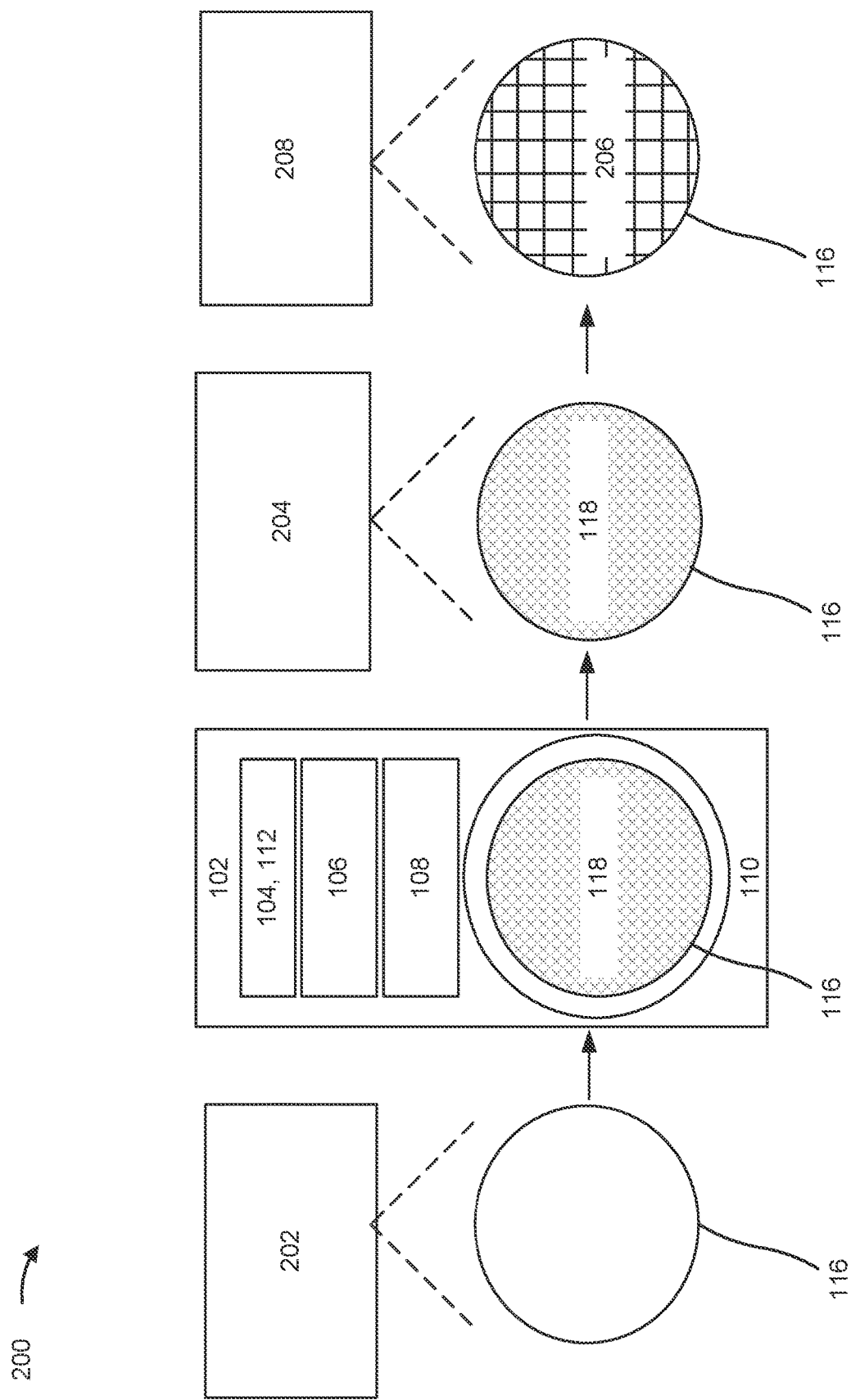
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a coating device 202, cooling device 102, an exposure device 204, and a developer device 208. In some implementations, devices of environment 200 may interconnect via wired connections, wireless connections, or a combination of wired and wireless connections.

Devices 102, 202, 204, and 208 may implement one or more semiconductor processing techniques to process wafer 116. Wafer 116 may include a semiconductor wafer formed of various semiconducting, insulating, and/or conductive materials. Wafer 116 may be processed such that one or more semiconductor structures are formed thereon, such as transistors (e.g., FinFETs and/or other types of transistors), processors, memory devices, integrated circuits, and/or the like.

Coating device 202 includes one or more devices capable of forming, depositing, and/or otherwise applying photoresist 118 to wafer 116 (e.g., to a surface of wafer 116). In some implementations, coating device 202 is capable of applying photoresist 118 by spin coating or another suitable technique for coating wafer 116 with photoresist 118. Photoresist 118 may include a layer of radiation sensitive material capable of being patterned via exposure to a radiation source, such as an ultraviolet light (UV) source (e.g., a deep UV light source, an extreme UV light source, and/or the like), an x-ray source, and/or the like. After photoresist 118 is applied to wafer 116, wafer 116 may be prebaked to remove excess photoresist solvents from photoresist 118.

Cooling device 102 includes one or more devices capable of cooling wafer 116 after photoresist 118 application and prebaking. As shown in FIG. 2, cooling device 102 may include sensor 104 and 112, cooling controller 106, signal converter 108, and cooling plate 110. As described above in connection with FIGS. 1A-1F, cooling device 102 may be a learning cooling plate device in that cooling device 102 is capable of determining a cooling time for wafer 116 based on a pattern mask area and/or one or more other parameters for wafer 116. In this way, cooling device 102 is capable of tailoring the cooling time for wafer 116 to reduce and/or minimize mask overlay variation for wafer 116 and exposure device 204. In some implementations, cooling device 102 (and devices 104-112 included therein) implements and/or performs the actions and techniques illustrated and described above in connection with FIGS. 1A-1F.

Sensor(s) 104 includes camera, a photosensor, a laser, and/or another type of device capable of generating wafer information associated with wafer 116, capable of providing the wafer information to cooling controller 106, and/or the like. The wafer information may include the various types of wafer information described above in connection with FIGS. 1A-1F and/or other types of wafer information. In some implementations, cooling plate sensor 112 may include a temperature sensing device, such as a thermocouple or resistive temperature detector (RDT), that senses the temperature of cooling plate 110, that provides an indication of the temperature of cooling plate 110, that provides an indication of a default cooling time, or a combination thereof to cooling controller 106. In some implementations, cooling plate sensor 112 includes a proximity sensor associated with cooling plate 110 configured to detect the presence of wafer 116 proximate to cooling plate 110 (e.g., to generate a signal based on whether wafer 116 is placed on cooling plate 110). In some implementations, sensor 104 and 112 implement and/or perform the actions and techniques illustrated and described above in connection with FIGS. 1A-1F.

Cooling controller 106 includes a processor, a microcontroller, a computer (e.g., a desktop computer, a laptop computer, a tablet computer, a server, and/or the like), and/or another type of processing device capable of determining a pattern mask area for wafer 116, (e.g., based on the wafer information received from sensor(s) 104), capable of determining a cooling time for wafer 116 (e.g., based on the pattern mask area), capable of controlling cooling plate 110 based on the cooling time, and/or the like. In some implementations, cooling controller 106 implements and/or performs the actions and techniques illustrated and described above in connection with FIGS. 1A-1F.

Signal converter 108 includes an analog-to-digital converter, a digital-to-analog converter, and/or another type of device that is capable of converting signals between cooling controller 106 and cooling plate 110 between analog and digital formats. For example, signal converter 108 may receive a digital signal from cooling controller 106 and may convert the digital signal to an analog signal to cause cooling plate 110 to cool wafer 116. As another example, signal converter 108 may receive an analog signal from cooling plate 110 (e.g., a thermocouple signal or RDT signal indicating a temperature of cooling plate 110, a proximity sensor signal indicating presence of wafer 116, and/or the like), may convert the analog signal to a digital signal, and may provide the digital signal to cooling controller 106. In some implementations, signal converter 108 implements and/or performs the actions and techniques illustrated and described above in connection with FIGS. 1A-1F.

Cooling plate 110 includes one of various types of cooling plates or cooling plate holders capable of cooling wafer 116. In some implementations, wafer 116 may be placed on cooling plate 110, and cooling plate 110 may extract or remove heat from wafer 116 to cool wafer 116. In some implementations, cooling plate 110 implements and/or performs the actions and techniques illustrated and described above in connection with FIGS. 1A-1F.

Exposure device 204 includes one or more devices capable of exposing photoresist 118 to a radiation source, such as one or more of the radiation sources described above, to transfer a pattern 206 from a photomask to photoresist 118. Pattern 206 may include one or more semiconductor device layer patterns for forming one or more semiconductor devices in and/or on wafer 116. In some implementations, exposure device 204 is a scanner, a stepper, or a similar type of exposure device. In some implementations, cooling device 102 and exposure device 204 are included in the same device or system. In some implementations, cooling device 102 and exposure device 204 are separate and/or standalone devices or systems.

Developer device 208 includes one or more devices capable of developing pattern 206 on wafer 116 after photoresist 118 is exposed to a radiation source by exposure device 204. In some implementations, developer device 208 develops pattern 206 by removing unexposed portions of photoresist 118 from wafer 116. In some implementations, developer device 208 develops pattern 206 by removing exposed portions of photoresist 118 from wafer 116. In some implementations, developer device 208 develops pattern 206 by dissolving exposed or unexposed portions of photoresist 118 through the use of a chemical developer.

The number and arrangement of devices and networks shown in FIG. 2 are provided as one or more examples. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
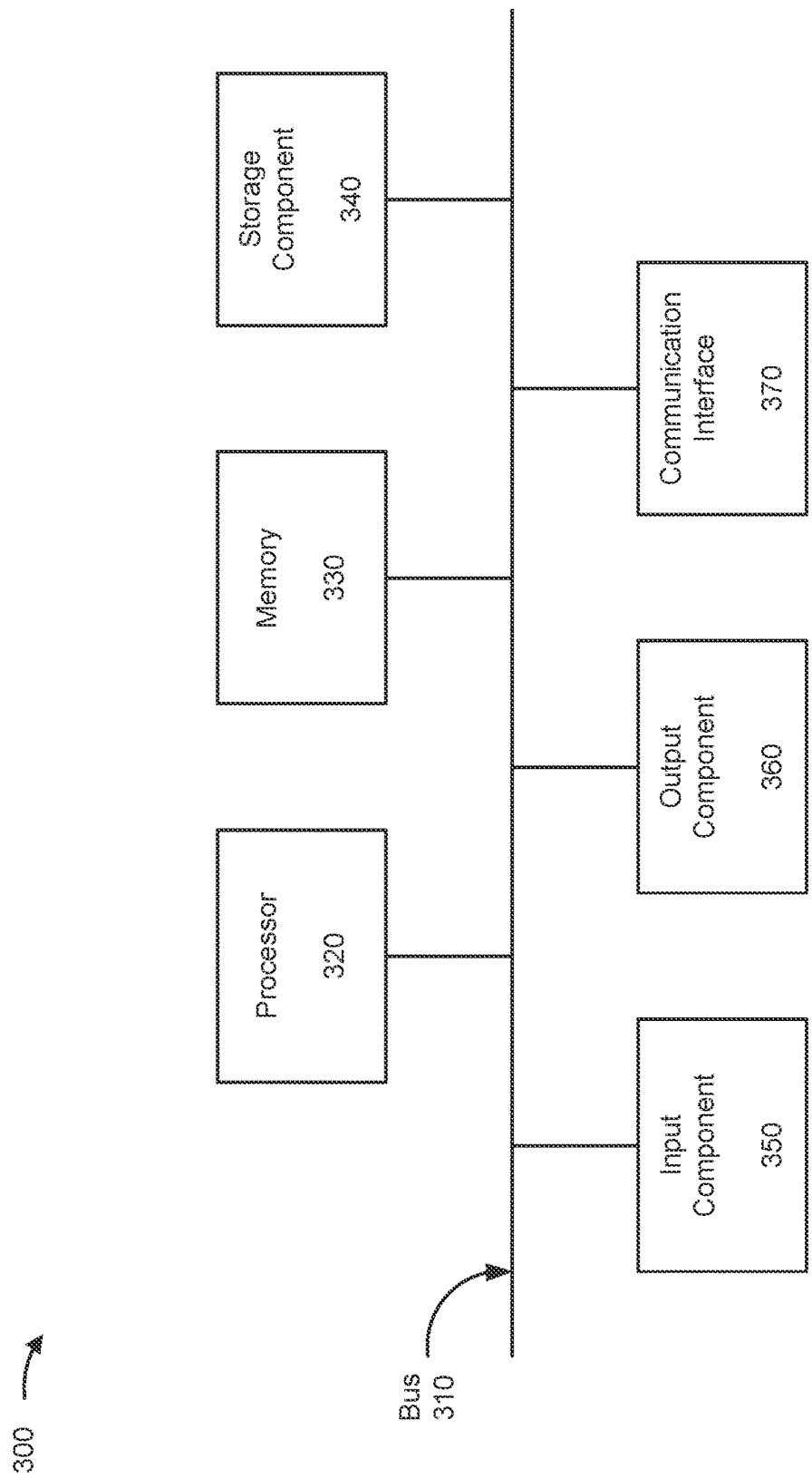
FIG. 3 is a diagram of example components of one or more devices of FIG. 2.

FIG. 3 is a diagram of example components of a device 300. Device 300 may correspond to coating device 202, cooling device 102, sensor(s) 104, cooling controller 106, signal converter 108, cooling plate sensor 112, exposure device 204, developer device 208, and/or the like. In some implementations, coating device 202, cooling device 102, sensor(s) 104, cooling controller 106, signal converter 108, cooling plate sensor 112, exposure device 204, developer device 208, and/or the like may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among multiple components of device 300. Processor 320 is implemented in hardware, firmware, and/or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a component for determining location (e.g., a global positioning system (GPS) component) and/or a sensor (e.g., an accelerometer, a gyroscope, an actuator, another type of positional or environmental sensor, and/or the like). Output component 360 includes a component that provides output information from device 300 (via, e.g., a display, a speaker, a haptic feedback component, an audio or visual indicator, and/or the like).

Communication interface 370 includes a transceiver-like component (e.g., a transceiver, a separate receiver, a separate transmitter, and/or the like) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. As used herein, the term "computer-readable medium" refers to a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
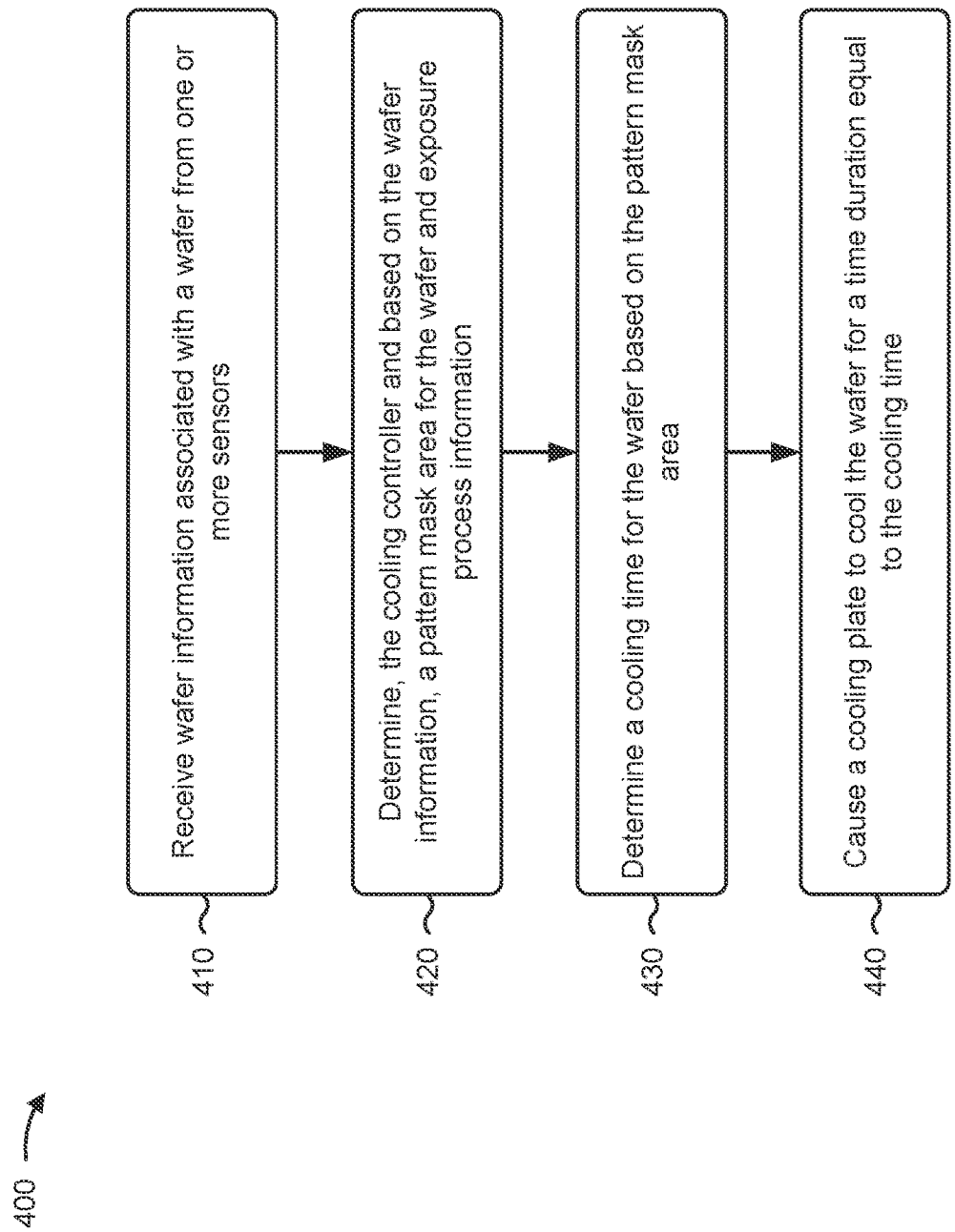
FIGS. 4-8 are flowcharts of example processes for semiconductor wafer cooling.

FIG. 4 is a flow chart of an example process 400 for semiconductor wafer cooling. In some implementations, one or more process blocks of FIG. 4 may be performed by a cooling controller (e.g., cooling controller 106 or device 300). In some implementations, one or more process blocks of FIG. 4 may be performed by another device or a group of devices separate from or including the cooling controller, such as cooling device 102, sensor(s) 104, signal converter 108, cooling plate 110, cooling plate sensor 112, or a combination thereof.

As shown in FIG. 4, process 400 may include receiving wafer information associated with a wafer from one or more sensors (block 410). For example, the cooling controller (e.g., using processor 320, memory 330, storage component 340, input component 350, output component 360, communication interface 370, and/or the like) may receive wafer information associated with a wafer (e.g., wafer 116) from one or more sensors (e.g., sensor(s) 104), as described above.

As further shown in FIG. 4, process 400 may include determining, based on the wafer information, a pattern mask area for the wafer and exposure process information (block 420). For example, the cooling controller (e.g., using processor 320, memory 330, storage component 340, input component 350, output component 360, communication interface 370, and/or the like) may determine, based on the wafer information, a pattern mask area for the wafer and exposure process information, as described above.

As further shown in FIG. 4, process 400 may include determining a cooling time for the wafer based on the pattern mask area (block 430). For example, the cooling controller (e.g., using processor 320, memory 330, storage component 340, input component 350, output component 360, communication interface 370, and/or the like) may determine a cooling time for the wafer based on the pattern mask area, as described above.

As further shown in FIG. 4, process 400 may include causing a cooling plate to cool the wafer for a time duration equal to the cooling time (block 440). For example, the cooling controller (e.g., using processor 320, memory 330, storage component 340, input component 350, output component 360, communication interface 370, and/or the like) may cause a cooling plate (e.g., cooling plate 110) to cool the wafer for a time duration equal to the cooling time, as described above.

Process 400 may include additional implementations, such as any single implementation or any combination of implementations described below and/or in connection with one or more other processes described elsewhere herein.

In a first implementation, the wafer information includes an image scan of the wafer, and determining the pattern mask area for the wafer includes determining a center point of the wafer based on the image scan, determining a plurality of field edge points for the wafer that is based on the center point, and determining the pattern mask area based on the plurality of field edge points. In a second implementation, alone or in combination with the first implementation, a first vector between a first edge point of the plurality of edge points and the center point is orthogonal to a second vector between a second edge point of the plurality of edge points and the center point. In a third implementation, alone or in combination with one or more of the first and second implementations, the center point of the wafer is based on a plurality of edge points for the wafer.

In a fourth implementation, alone or in combination with one or more of the first through third implementations, a quantity of the plurality of edge points is different from a quantity of the plurality of field edge points. In a fifth implementation, alone or in combination with one or more of the first through fourth implementations, determining the pattern mask area includes determining the pattern mask area based on wafer information associated with the wafer. In a sixth implementation, alone or in combination with one or more of the first through fifth implementations, determining the cooling time includes determining the cooling time based on a default cooling time.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
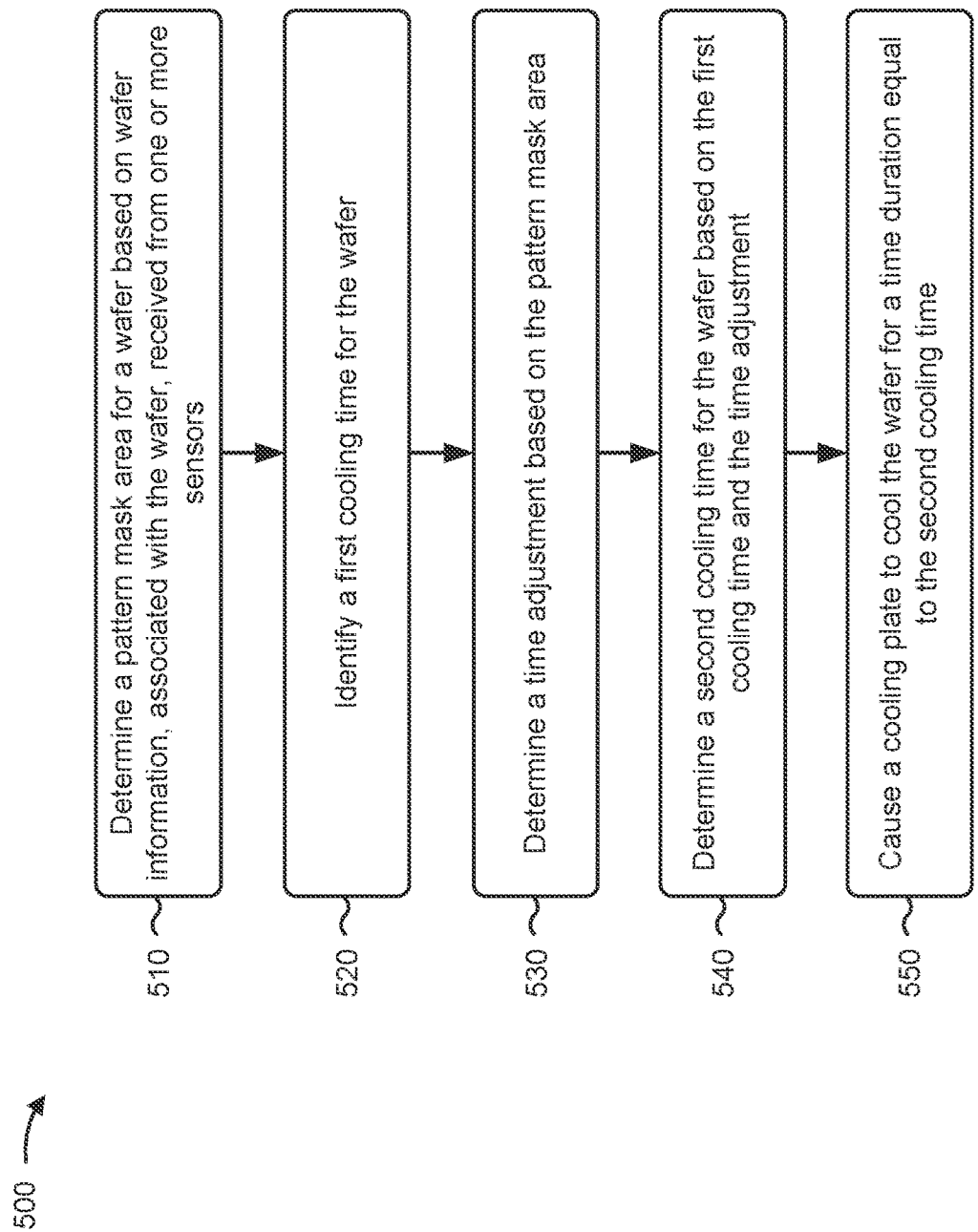

FIG. 5 is a flow chart of an example process 500 for semiconductor wafer cooling. In some implementations, one or more process blocks of FIG. 5 may be performed by a cooling controller (e.g., cooling controller 106 or device 300). In some implementations, one or more process blocks of FIG. 5 may be performed by another device or a group of devices separate from or including the cooling controller, such as cooling device 102, sensor(s) 104, signal converter 108, cooling plate 110, cooling plate sensor 112, or a combination thereof.

As shown in FIG. 5, process 500 may include determining a pattern mask area for a wafer based on wafer information, associated with the wafer, received from one or more sensors (block 510). For example, the cooling controller (e.g., using processor 320, memory 330, storage component 340, input component 350, output component 360, communication interface 370, and/or the like) may determine a pattern mask area for a wafer (e.g., wafer 116) based on wafer information, associated with the wafer, received from one or more sensors (e.g., sensor(s) 104), as described above.

As further shown in FIG. 5, process 500 may include identifying a first cooling time for the wafer (block 520). For example, the cooling controller (e.g., using processor 320, memory 330, storage component 340, input component 350, output component 360, communication interface 370, and/or the like) may identify a first cooling time for the wafer, as described above.

As further shown in FIG. 5, process 500 may include determining a time adjustment based on the pattern mask area (block 530). For example, the cooling controller (e.g., using processor 320, memory 330, storage component 340, input component 350, output component 360, communication interface 370, and/or the like) may determine a time adjustment based on the pattern mask area, as described above.

As further shown in FIG. 5, process 500 may include determining a second cooling time for the wafer based on the first cooling time and the time adjustment (block 540). For example, the cooling controller (e.g., using processor 320, memory 330, storage component 340, input component 350, output component 360, communication interface 370, and/or the like) may determine a second cooling time for the wafer based on the first cooling time and the time adjustment, as described above.

As further shown in FIG. 5, process 500 may include causing a cooling plate to cool the wafer for a time duration equal to the second cooling time (block 550). For example, the cooling controller (e.g., using processor 320, memory 330, storage component 340, input component 350, output component 360, communication interface 370, and/or the like) may cause a cooling plate (e.g., cooling plate 110) to cool the wafer for a time duration equal to the second cooling time, as described above.

Process 500 may include additional implementations, such as any single implementation or any combination of implementations described below and/or in connection with one or more other processes described elsewhere herein.

In a first implementation, determining the time adjustment includes determining the time adjustment based on a scaling factor applied to the pattern mask area. In a second implementation, alone or in combination with the first implementation, the scaling factor is a positive value if the pattern mask area does not satisfy a pattern mask area threshold. In a third implementation, alone or in combination with one or more of the first and second implementations, the scaling factor is a negative value if the pattern mask area satisfies a pattern mask area threshold.

In a fourth implementation, alone or in combination with one or more of the first through third implementations, causing the cooling plate to cool the wafer for the time duration equal to the second cooling time includes transmitting a first cooling control signal to the cooling plate at a start of the second cooling time and transmitting a second cooling control signal to the cooling plate at an end of the cooling time. In a fifth implementation, alone or in combination with one or more of the first through fourth implementations, transmitting the first cooling control signal includes transmitting the first cooling control signal via a signal converter (e.g., signal converter 108), and transmitting the second cooling control signal includes transmitting the second cooling control signal via the signal converter. In a sixth implementation, alone or in combination with one or more of the first through fifth implementations, determining the second cooling time includes adjusting the first cooling time based on the time adjustment.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
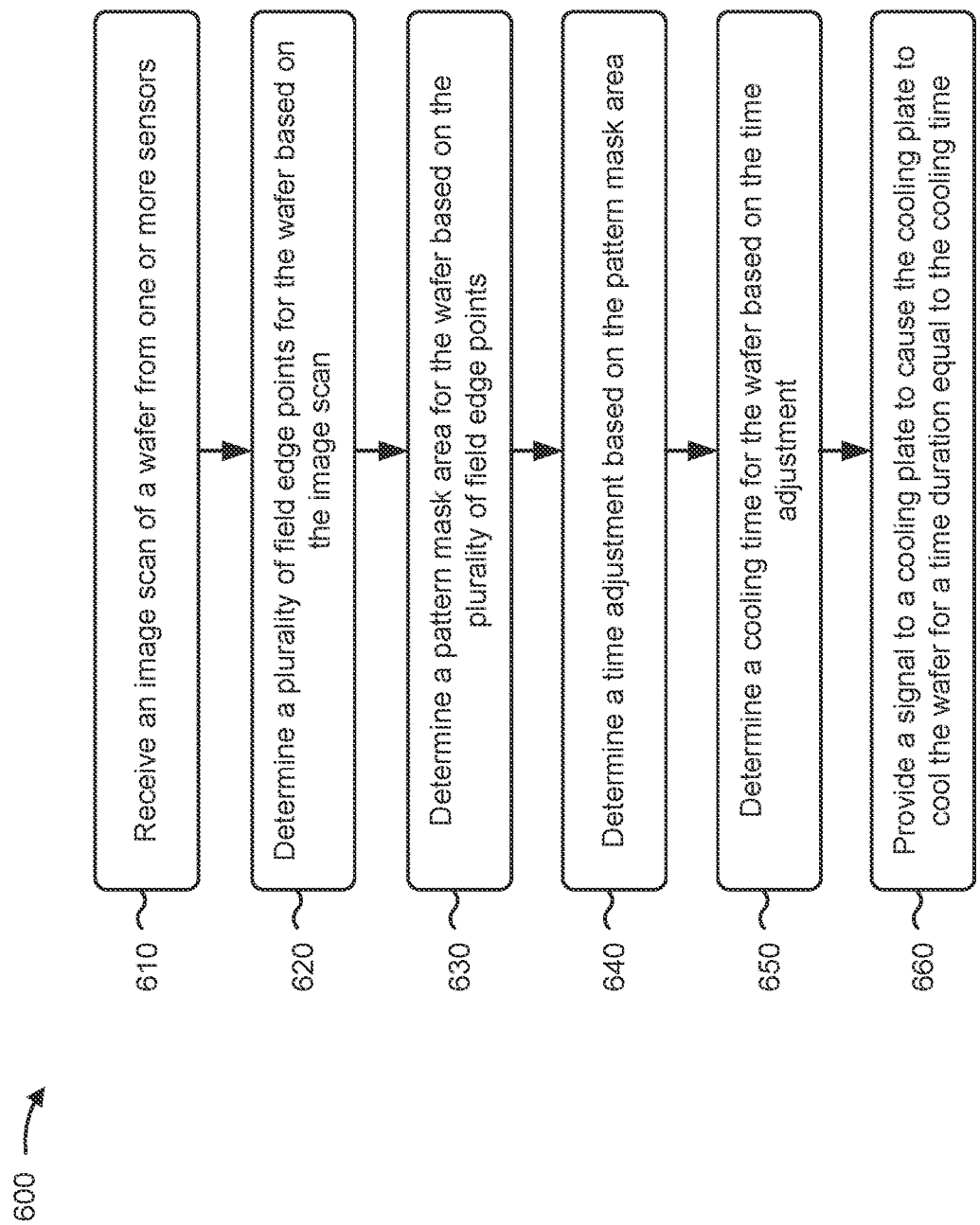

FIG. 6 is a flow chart of an example process 600 for semiconductor wafer cooling. In some implementations, one or more process blocks of FIG. 6 may be performed by a cooling controller (e.g., cooling controller 106 or device 300). In some implementations, one or more process blocks of FIG. 6 may be performed by another device or a group of devices separate from or including the cooling controller, such as cooling device 102, sensor(s) 104, signal converter 108, cooling plate 110, cooling plate sensor 112, or a combination thereof.

As shown in FIG. 6, process 600 may include receiving an image scan of a wafer from one or more sensors (block 610). For example, the cooling controller (e.g., using processor 320, memory 330, storage component 340, input component 350, output component 360, communication interface 370, and/or the like) may receive an image scan of a wafer (e.g., wafer 116) from one or more sensors (e.g., sensor(s) 104), as described above.

As further shown in FIG. 6, process 600 may include determine a plurality of field edge points for the wafer based on the image scan (block 620). For example, the cooling controller (e.g., using processor 320, memory 330, storage component 340, input component 350, output component 360, communication interface 370, and/or the like) may determine a plurality of field edge points (e.g., field edge points D, E, F, and G) for the wafer based on the image scan, as described above.

As further shown in FIG. 6, process 600 may include determining a pattern mask area for the wafer based on the plurality of field edge points (block 630). For example, the cooling controller (e.g., using processor 320, memory 330, storage component 340, input component 350, output component 360, communication interface 370, and/or the like) may determine a pattern mask area for the wafer based on the plurality of field edge points, as described above.

As further shown in FIG. 6, process 600 may include determining a time adjustment based on the pattern mask area (block 640). For example, the cooling controller (e.g., using processor 320, memory 330, storage component 340, input component 350, output component 360, communication interface 370, and/or the like) may determine a time adjustment based on the pattern mask area, as described above.

As further shown in FIG. 6, process 600 may include determining a cooling time for the wafer based on the time adjustment (block 650). For example, the cooling controller (e.g., using processor 320, memory 330, storage component 340, input component 350, output component 360, communication interface 370, and/or the like) may determine a cooling time for the wafer based on the time adjustment, as described above.

As further shown in FIG. 6, process 600 may include providing a signal to a cooling plate to cause the cooling plate to cool the wafer for a time duration equal to the cooling time (block 660). For example, the cooling controller (e.g., using processor 320, memory 330, storage component 340, input component 350, output component 360, communication interface 370, and/or the like) may provide a signal to a cooling plate (e.g., cooling plate 110) to cause the cooling plate to cool the wafer for a time duration equal to the cooling time, as described above.

Process 600 may include additional implementations, such as any single implementation or any combination of implementations described below and/or in connection with one or more other processes described elsewhere herein.

In a first implementation, providing the signal to the cooling plate includes providing the signal to the cooling plate via a signal converter (e.g., signal converter 108). In a second implementation, alone or in combination with the first implementation, determining the cooling time includes adjusting a default cooling time based on the time adjustment and determining the cooling time based on the default cooling time being adjusted based on the time adjustment. In a third implementation, alone or in combination with one or more of the first and second implementations, the pattern mask area satisfies a threshold, and the time adjustment decreases the cooling time.

In a fourth implementation, alone or in combination with one or more of the first through third implementations, the pattern mask area does not satisfy a threshold, and the time adjustment increases the cooling time. In a fifth implementation, alone or in combination with one or more of the first through fourth implementations, process 600 includes receiving, from a cooling plate sensor (e.g., cooling plate sensor 112), an indication presence of the wafer on the cooling plate, and providing, to the one or more sensors and based on the information indicating presence of the wafer on the cooling plate, an indication to generate the image scan.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
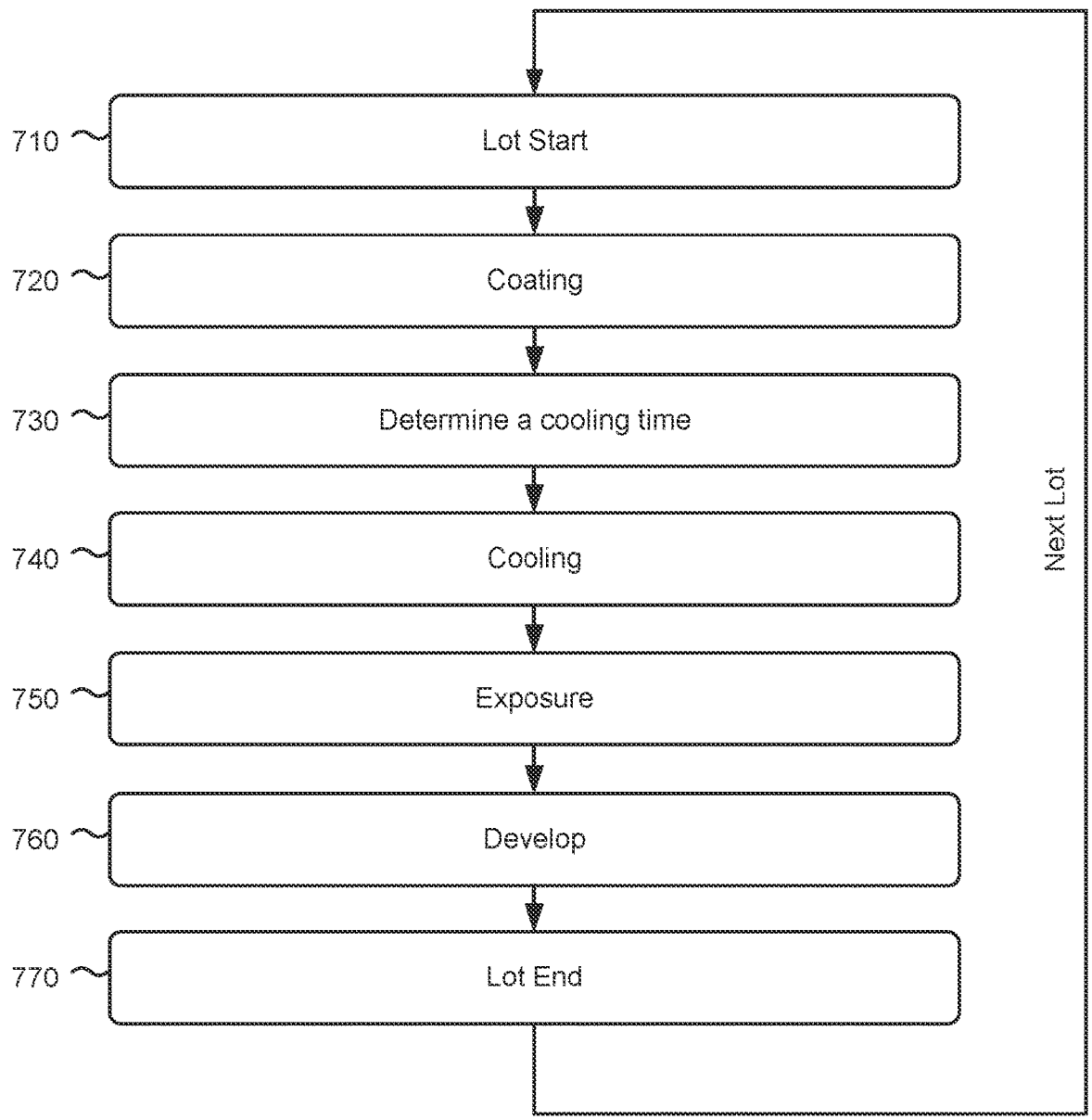

FIG. 7 is a flow chart of an example process 700 for semiconductor wafer cooling. In some implementations, one or more process blocks of FIG. 7 may be performed by one or more devices included in a semiconductor processing environment (e.g., environment 200 illustrated and described above in connection with FIG. 2), such as a coating device (e.g., coating device 202), a cooling device (e.g., cooling device 102), an exposure device (e.g., exposure device 204), a developer device (e.g., developer device 208), and/or the like.

As shown in FIG. 7, process 700 may include a lot start, where processing of a wafer lot begins (block 710). For example, the wafer lot may be provided to the coating device 202 at the lot start.

As further shown in FIG. 7, process 700 may include coating each wafer in the wafer lot with a photoresist (block 720). For example, the coating device (e.g., using processor 320, memory 330, storage component 340, input component 350, output component 360, communication interface 370, and/or the like) may coat each wafer (e.g., wafer 116) in the wafer lot with a photoresist (e.g., photoresist 118), as described above. The coating device may provide the wafer lot to the cooling device after coating each wafer in the wafer lot with a photoresist.

As further shown in FIG. 7, process 700 may include determining a cooling time for the wafer lot (block 730). For example, the cooling device (e.g., using sensor(s) 104, cooling controller 106, signal converter 108, cooling plate 110, cooling plate sensor 112, processor 320, memory 330, storage component 340, input component 350, output component 360, communication interface 370, and/or the like) may determine a cooling time for the wafer lot, as described above. The cooling device may determine a respective cooling time for each wafer in the wafer lot. In some implementations, the cooling device determines the cooling time for the wafer lot using the techniques described above.

As further shown in FIG. 7, process 700 may include cooling each wafer in the wafer lot for the cooling time (block 740). For example, the cooling device (e.g., using sensor(s) 104, cooling controller 106, signal converter 108, cooling plate 110, cooling plate sensor 112, processor 320, memory 330, storage component 340, input component 350, output component 360, communication interface 370, and/or the like) may cool each wafer in the wafer lot for a time duration equal to the cooling time, as described above. The cooling device may provide the wafer lot to the exposure device after cooling the wafer lot.

As further shown in FIG. 7, process 700 may include exposing each the wafer lot to a radiation source (block 750). For example, the exposure device (e.g., using processor 320, memory 330, storage component 340, input component 350, output component 360, communication interface 370, and/or the like) may expose each wafer in the wafer lot to a radiation source to transfer a pattern (e.g., pattern 206) from a photomask to the photoresist on each wafer in the wafer lot, as described above.

As further shown in FIG. 7, process 700 may include developing the pattern transferred to the photoresist on each wafer in the wafer lot (block 760). For example, the developer device (e.g., using processor 320, memory 330, storage component 340, input component 350, output component 360, communication interface 370, and/or the like) may develop the pattern transferred to the photoresist on each wafer in the wafer lot, as described above.

As further shown in FIG. 7, process 700 may include completing the processing of the wafer lot (block 770). After completion of the wafer lot, the next wafer lot may begin processing through blocks 710-770.

Process 700 may include additional implementations, such as any single implementation or any combination of implementations described above and/or in connection with one or more other processes described elsewhere herein.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
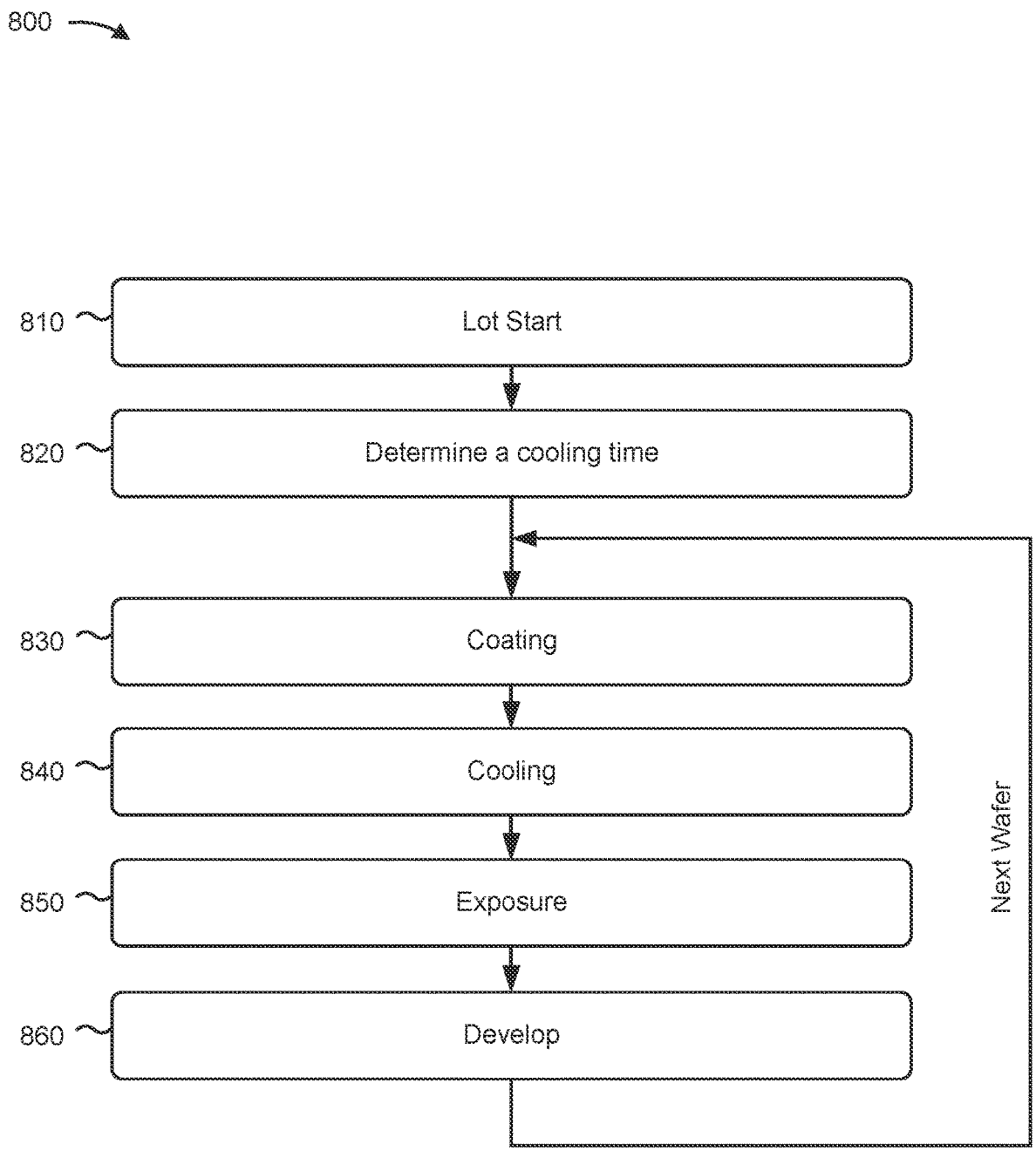

FIG. 8 is a flow chart of an example process 800 for semiconductor wafer cooling. In some implementations, one or more process blocks of FIG. 8 may be performed by one or more devices included in a semiconductor processing environment (e.g., environment 200 illustrated and described above in connection with FIG. 2), such as a coating device (e.g., coating device 202), a cooling device (e.g., cooling device 102), an exposure device (e.g., exposure device 204), a developer device (e.g., developer device 208), and/or the like.

As shown in FIG. 8, process 800 may include a lot start, where processing of a wafer lot begins (block 810). As further shown in FIG. 8, process 800 may include determining a cooling time for the wafer lot (block 820). For example, the cooling device (e.g., using sensor(s) 104, cooling controller 106, signal converter 108, cooling plate 110, cooling plate sensor 112, processor 320, memory 330, storage component 340, input component 350, output component 360, communication interface 370, and/or the like) may determine a cooling time for the wafer lot, as described above. The cooling device may determine a wafer lot cooling time, which may be a single cooling time that is used for all wafers in the wafer lot. In some implementations, the cooling device determines the cooling time for the wafer lot using the techniques described above.

As further shown in FIG. 8, process blocks 830-860 may performed for each wafer in the wafer lot. That is, a first wafer may be processed a block 830 and may proceed to block 840 while a second wafer is processed at block 830, and so on. Accordingly, process 800 may include coating a wafer in the wafer lot with a photoresist (block 830). For example, the coating device (e.g., using processor 320, memory 330, storage component 340, input component 350, output component 360, communication interface 370, and/or the like) may coat a wafer (e.g., wafer 116) in the wafer lot with a photoresist (e.g., photoresist 118), as described above. The coating device may provide the wafer to the cooling device after coating the wafer with a photoresist.

As further shown in FIG. 8, process 800 may include cooling the wafer based on the cooling time (block 840). For example, the cooling device (e.g., using sensor(s) 104, cooling controller 106, signal converter 108, cooling plate 110, cooling plate sensor 112, processor 320, memory 330, storage component 340, input component 350, output component 360, communication interface 370, and/or the like) may cool the wafer for a time duration equal to the cooling time that was determined for the wafer lot. The cooling device may provide the wafer to the exposure device after cooling the wafer.

As further shown in FIG. 8, process 800 may include exposing the wafer to a radiation source (block 850). For example, the exposure device (e.g., using processor 320, memory 330, storage component 340, input component 350, output component 360, communication interface 370, and/or the like) may expose the wafer to a radiation source to transfer a pattern (e.g., pattern 206) from a photomask to the photoresist on wafer, as described above.

As further shown in FIG. 8, process 800 may include developing the pattern transferred to the photoresist on the wafer (block 860). For example, the developer device (e.g., using processor 320, memory 330, storage component 340, input component 350, output component 360, communication interface 370, and/or the like) may develop the pattern transferred to the photoresist on the wafer, as described above.

Process 800 may include additional implementations, such as any single implementation or any combination of implementations described above and/or in connection with one or more other processes described elsewhere herein.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a cooling device (e.g., 102) is a learning cooling device in that the cooling device is capable of determining a cooling time for a wafer as opposed to using a default or fixed cooling time for cooling the wafer. The cooling device determines the cooling time for the wafer based on a pattern mask area for the wafer, which may be an indicator of the exposure time for an exposure stage for the wafer. The cooling device causes the cooling plate to cool the wafer for an amount of time equal to the cooling time. This ensures that the wafer exposure time and cooling time are synchronized, which reduces photomask misalignment between different exposure stages for a wafer and increases photomask overlay performance.

As described in greater detail above, some implementations described herein provide a method. The method includes receiving wafer information associated with a wafer from one or more sensors. The method includes determining, based on the wafer information, a pattern mask area for the wafer and exposure process information. The method includes determining a cooling time for the wafer based on the pattern mask area. The method includes causing a cooling plate to cool the wafer for a time duration equal to the cooling time.

As described in greater detail above, some implementations described herein provide a method. The method includes determining a pattern mask area for a wafer based on wafer information, associated with the wafer, received from one or more sensors. The method includes identifying a first cooling time for the wafer. The method includes determining a time adjustment based on the pattern mask area. The method includes determining a second cooling time for the wafer based on the first cooling time and the time adjustment. The method includes causing a cooling plate to cool the wafer for a time duration equal to the second cooling time.

As described in greater detail above, some implementations described herein provide a device. The device includes a cooling controller to receive wafer information, associated with a wafer, from one or more sensors. The wafer information is based on a scan of a wafer. The cooling controller is further to determine a pattern mask area for the wafer based a field size indicated by the wafer information. The cooling controller is further to determine a time adjustment based on the pattern mask area. The cooling controller is further to determine a cooling time for the wafer based on the time adjustment. The cooling controller is further to provide a signal to a cooling plate to cause the cooling plate to cool the wafer for a time duration equal to the cooling time.

As described in greater detail above, some implementations described herein provide a method. The method includes coating each wafer in the wafer lot with a photoresist. The method includes determining a cooling time for the wafer lot. The method includes cooling each wafer in the wafer lot based on the cooling time. The method includes exposing each wafer in the wafer lot to a radiation source to transfer a pattern from a photomask to the photoresist. The method includes The method includes developing the pattern transferred to the photoresist on each wafer in the wafer lot.

As described in greater detail above, some implementations described herein provide a system. The system includes one or more sensors to generate an image scan of a wafer and provide the image scan to a cooling controller. The system includes the cooling controller to determine a plurality of field edge points for the wafer based on the image scan, determine a pattern mask area for the wafer based on the plurality of field edge points, determine a time adjustment based on the pattern mask area, determine a cooling time for the wafer based on the time adjustment, and provide a signal to a cooling plate based on the cooling time. The system includes the cooling plate to cool the wafer for a time duration equal to the cooling time based on the signal.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving, by a cooling controller, wafer information associated with a wafer from one or more sensors;
   determining, by the cooling controller and based on the wafer information, a center point of the wafer,
      wherein the center point of the wafer is based on a plurality of edge points for the wafer;
   determining, by the cooling controller and based on the center point, a plurality of field edge points for the wafer,
      wherein a quantity of the plurality of edge points is different from a quantity of the plurality of field edge points;
   determining, by the cooling controller, a pattern mask area based on the plurality of field edge points;
   determining, by the cooling controller, a cooling time for the wafer based on the pattern mask area and exposure process information; and
   causing, by the cooling controller, a cooling plate to cool the wafer for a time duration equal to the cooling time.

2. The method of claim 1, further comprising:
   determining the plurality of edge points based on an image scan of the wafer.

3. The method of claim 1, wherein the plurality of edge points are equally spaced apart along a perimeter of the wafer.

4. The method of claim 1, wherein determining the center point comprises:
   determining respective vectors from each edge point of the plurality of edge points; and
   determining a point of intersection of the respective vectors as the center point.

5. The method of claim 1, wherein determining the plurality of field edge points comprises:
   determining a first vector from the center point; and
   determining a second vector from the center point and orthogonal to the first vector.

6. The method of claim 1, wherein determining the pattern mask area based on the plurality of field edge points comprises:
   determining connecting lines between adjacent field edge points, of the plurality of field edge points, to form an enclosed area around the center point.

7. The method of claim 6, wherein determining the pattern mask area based on the plurality of field edge points further comprises:
   determining the pattern mask area based on a length and a width of the enclosed area.

8. A method, comprising:
coating a wafer with a photoresist;
determining a cooling time for the wafer by:
- determining a time adjustment based on a scaling factor applied to a pattern mask area for the wafer; and
- applying the time adjustment to a default cooling time;

causing a cooling plate to cool the wafer for a time duration equal to the cooling time;
exposing the wafer to a radiation source to transfer a pattern from a photomask to the photoresist; and
developing the pattern transferred to the photoresist on the wafer.

9. The method of claim 8, further comprising:
determining the pattern mask area based on a center point of the wafer.

10. The method of claim 8, wherein determining the cooling time comprises:
determining the cooling time based on a mask field utilization for the wafer.

11. The method of claim 8, wherein the time duration equal to the cooling time is shorter in than a time duration equal to the default cooling time.

12. The method of claim 8, wherein causing the cooling plate to cool the wafer for the time duration comprises:
transmitting a cooling control signal to the cooling plate at a start of the cooling time.

13. The method of claim 8, wherein causing the cooling plate to cool the wafer for the time duration further comprises:
transmitting another cooling control signal to the cooling plate at an end of the cooling time.

14. The method of claim 8, further comprising:
determining the pattern mask area based on a plurality of field edge points for the wafer.

15. A system, comprising:
one or more sensors configured to:
- generate an image scan of a wafer, and
- provide the image scan to a cooling controller;

the cooling controller configured to:
- receive information indicating a presence of the wafer on a cooling plate;
- provide, to the one or more sensors and based on the information indicating the presence of the wafer on the cooling plate, an indication to generate the image scan;
- determine a plurality of field edge points for the wafer based on the image scan,
- determine a pattern mask area for the wafer based on the plurality of field edge points,
- determine a time adjustment based on the pattern mask area,
- determine a cooling time for the wafer based on the time adjustment, and
- provide a signal to the cooling plate based on the cooling time; and the cooling plate configured to cool the wafer for a time duration equal to the cooling time based on the signal.

16. The system of claim 15, further comprising:
a cooling plate sensor configured to detect the presence of the wafer on the cooling plate.

17. The system of claim 16, wherein the cooling plate sensor is further configured to:
provide an indication of a temperature of the cooling plate to the cooling controller.

18. The system of claim 15, wherein the cooling controller, to determine the cooling time, is configured to:
adjust a default cooling time using the time adjustment.

19. The system of claim 15, wherein the cooling controller is further configured to:
provide another signal to the cooling plate to cause the cooling plate to stop cooling the wafer.

20. The system of claim 15, wherein the cooling controller, to determine the time adjustment, is configured to:
determine the time adjustment based on a scaling factor applied to the pattern mask area.

\* \* \* \* \*